(12) United States Patent
Bae

(10) Patent No.: US 7,399,698 B2
(45) Date of Patent: Jul. 15, 2008

(54) SEMICONDUCTOR DEVICE AND METHOD OF MANUFACTURING THE SAME

(75) Inventor: Se-Yeul Bae, Kyungki-do (KR)

(73) Assignee: Dongbu Electronics Co., Ltd, Seoul (KR)

( * ) Notice: Subject to any disclaimer, the term of this patent is extended or adjusted under 35 U.S.C. 154(b) by 258 days.

(21) Appl. No.: 11/320,697

(22) Filed: Dec. 30, 2005

(65) Prior Publication Data

US 2006/0163700 A1 Jul. 27, 2006

(30) Foreign Application Priority Data

Dec. 30, 2004 (KR) .................... 10-2004-0117438

(51) Int. Cl.
- H01L 21/4763 (2006.01)
- H01L 21/283 (2006.01)
- H01L 21/311 (2006.01)
- H01L 21/441 (2006.01)

(52) U.S. Cl. .................. 438/624; 438/637; 438/460; 438/462

(58) Field of Classification Search ........... 438/622, 438/624, 637, 740, 460, 462; 257/E21.575, 257/E21.576

See application file for complete search history.

(56) References Cited

U.S. PATENT DOCUMENTS

| | | | | |
|---|---|---|---|---|
| 4,523,372 A | * | 6/1985 | Balda et al. ................ | 438/623 |
| 5,162,260 A | * | 11/1992 | Leibovitz et al. ............ | 216/18 |
| 5,306,947 A | * | 4/1994 | Adachi et al. ............... | 257/642 |
| 5,397,743 A | * | 3/1995 | Jun et al. ..................... | 438/624 |
| 5,593,921 A | * | 1/1997 | Chen et al. .................. | 438/624 |
| 5,818,110 A | * | 10/1998 | Cronin ....................... | 257/775 |
| 6,037,668 A | * | 3/2000 | Cave et al. .................. | 257/784 |
| 7,223,693 B2 | * | 5/2007 | Choi et al. .................. | 438/672 |
| 7,241,681 B2 | * | 7/2007 | Kumar et al. ............... | 438/618 |
| 2006/0244133 A1 | * | 11/2006 | Chen et al. .................. | 257/728 |

* cited by examiner

Primary Examiner—M. Wilczewski
(74) Attorney, Agent, or Firm—Finnegan, Henderson, Henderson, Garrett & Dunner, L.L.P.

(57) ABSTRACT

A method of manufacturing a semiconductor device includes: forming a first pad including a first metal and an inter-connection line including the first metal in a scribe lane region; forming a second pad including the first metal in a chip region; sequentially forming an etch-stop layer and a first insulation layer on the first pad, the inter-connection line, and the second pad; exposing the first and second pads by patterning the etch-stop layer and the first insulation layer; forming third and fourth pads including a second metal on the first and second pads; sequentially forming second and third insulation layers on the third pad, the fourth pad, and the patterned first insulation layer; and etching the first, second, and third insulation layers using the patterned photosensitive layer on the third insulation layer to expose the third and fourth pads.

12 Claims, 5 Drawing Sheets

SEMICONDUCTOR DEVICE AND METHOD OF MANUFACTURING THE SAME

CROSS-REFERENCE TO RELATED APPLICATION

This application claims the benefit of priority of Korean Patent Application No. 10-2004-0117438, filed in the Korean Intellectual Property Office on Dec. 30, 2004, the entire contents of which are incorporated herein by reference.

BACKGROUND (a) Technical Field

The present invention relates to a semiconductor device and a method of manufacturing the same. More particularly, the present invention relates to a semiconductor device and a method of manufacturing the same, wherein an exposure of a copper line in a scribe lane region can be prevented in a case of forming a plurality of chips in a single wafer.

(b) Description of the Related Art

As semiconductor devices become more highly integrated, a size of a semiconductor chip is reduced. After simultaneously forming a plurality of semiconductor chips on a single wafer, a packaging process is performed to saw each die or chip from the single wafer. To prevent damage to dies or chips during the packaging process, the chips or dies must be separated by a predetermined gap referred to as a scribe lane.

A scribe lane includes align keys for a lithographic process, overlay keys, and monitoring patterns for various processes. A scribe lane also includes electrical test patterns for process monitoring and feedback which are performed after a process. Therefore, a scribe lane includes a plurality of pads for electrical probing of electrical test patterns, and it also includes a plurality of inter-connection lines for connecting between pads or between a pad and a test pattern.

FIG. 1A to FIG. 1E are cross-sectional views showing a conventional method of manufacturing a semiconductor device.

As shown in FIG. 1A, a wafer 100 includes a scribe lane region where a scribe lane is formed and a chip region where a semiconductor chip is formed. A pad 110 and an inter-connection line 111, both of which include a metal, are formed in the scribe lane region of the wafer 100, and a pad 112 including a metal is formed in the chip region. The pad 110, inter-connection line 111, and pad 112 are formed by a metal line process using copper (Cu).

As shown in FIG. 1B, a first insulation layer 120 is deposited on pad 110, inter-connection line 111, and pad 112, and then etched using a mask to expose the pad 110 in the scribe lane region and the pad 112 in the chip region.

Referring to FIG. 1C, a metal pad comprising aluminum (Al) is formed on the pads 110 and 112. A second insulation layer 140 and a third insulation layer 150 are sequentially deposited on first insulation layer 120 and metal pad 130. Second insulation layer 140 and third insulation layer 150 are used as a passivation layer.

As shown in FIG. 1D, a photosensitive layer pattern 160 for exposing metal pad 130 is formed by using a mask. When passivation layers, such as second insulation layer 140 and third insulation layer 150, remain during the sawing process, the sawing process may severely damage the chip region through the passivation layers. Thus, the passivation layers in the scribe region, such as second insulation layer 140 and third insulation layer 150, are generally removed when metal pad 130 is exposed through an etching process. Accordingly, the photosensitive layer pattern 160 is patterned as shown in FIG. 1D to expose second and third insulation layers 140 and 150 on metal pad 130 in the scribe region.

As shown in FIG. 1E, using photosensitive layer pattern 160 as a mask, first insulation layer 120, second insulation layer 140, and third insulation layer 150 are etched so as to expose metal pad 130. In addition, region 'A' as shown in FIG. 1E, inter-connection line 111 is also exposed.

If inter-connection line 111 is exposed at room temperature for a long time, copper (Cu) in inter-connection line 111 may be rapidly corroded because through reaction with oxygen in the air, as a result of which inter-connection line 111 may fail or particles may be created in peripheral circuits and chips. Consequently, the yield and reliability of a semiconductor device may be deteriorated.

The above information disclosed in this Background section is only for enhancement of understanding of the background of the invention and therefore it may contain information that does not form the prior art that is already known in this country to a person of ordinary skill in the art.

SUMMARY

The present invention provides a semiconductor device and a method of manufacturing the same having advantages of preventing exposure of a copper line in a scribe lane region such that the yield and reliability of a semiconductor device can be enhanced.

Consistent with embodiments of the present invention, a method of manufacturing a semiconductor device on a wafer including a scribe lane region and a chip region includes: forming a first pad including a first metal and an inter-connection line including the first metal in the scribe lane region; forming a second pad including the first metal in the chip region; sequentially forming an etch-stop layer and a first insulation layer on the first pad, the inter-connection line, and the second pad; exposing the first and second pads by patterning the etch-stop layer and the first insulation layer; forming third and fourth pads including a second metal on the first and second pads; sequentially forming second and third insulation layers on the third pad, the fourth pad, and the patterned first insulation layer; and etching the first, second and third insulation layers using the patterned photosensitive layer on the third insulation layer to expose the third and fourth pads.

The first metal may be copper, and the second metal may be aluminum.

The etch-stop layer may have a different etching rate than the first, second, and third insulation layers. The etch-stop layer may comprise a nitride, and may have a sufficient thickness such that the second pad is not exposed when the first, second, and third insulation layers are etched.

Each of the first and second insulation layers may comprise an oxide, and the third insulation layer may comprise a nitride.

In addition, the second and third insulation layers are passivation layers.

Also consistent with embodiments of the present invention, a semiconductor device formed on a wafer including a scribe lane region and a chip region includes: a first pad including a first metal in the scribe lane region; an inter-connection line including the first metal in the scribe lane region; a second pad including the first metal in the chip region; a third pad including a second metal in contact with the first pad; a fourth pad including the second metal in contact with the second pad; and an etch-stop layer covering at least the inter-connection line.

The etch-stop layer may also be on portions of the first and second pads. The semiconductor device may further include first, second, and third insulation layers on the etch-stop layer on the second pad.

The first metal may be copper, and the second metal may be aluminum.

BRIEF DESCRIPTION OF THE DRAWINGS

The accompanying drawings, which are incorporated in and constitute a part of this specification, illustrate embodiments of the invention and, together with the description, serve to explain the features, advantages, and principles of the invention.

In the drawings.

DETAILED DESCRIPTION OF THE EMBODIMENTS

Figure 1A:
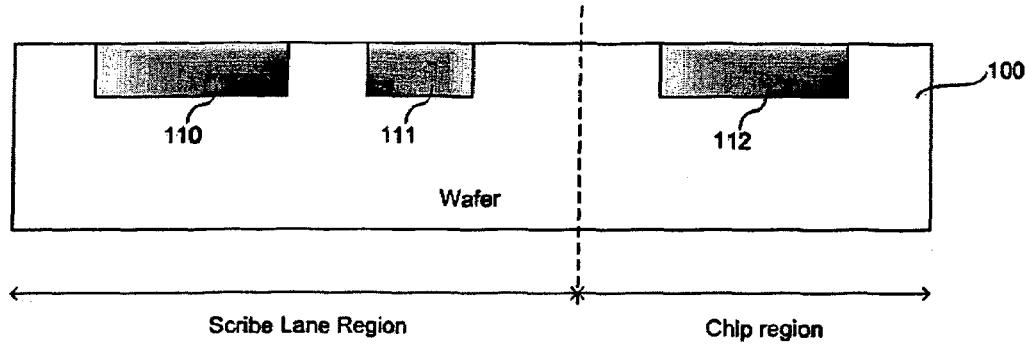
FIG. 1A to FIG. 1E are cross-sectional views showing a conventional method of manufacturing a semiconductor device.
Figure 1B:
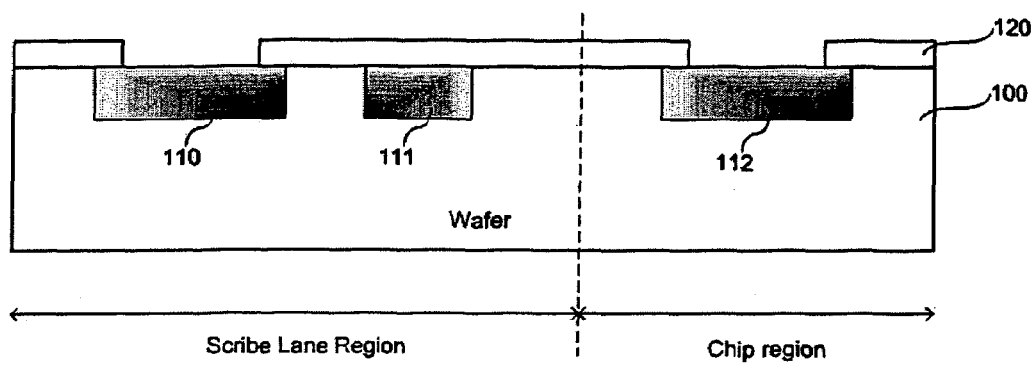
Figure 1C:
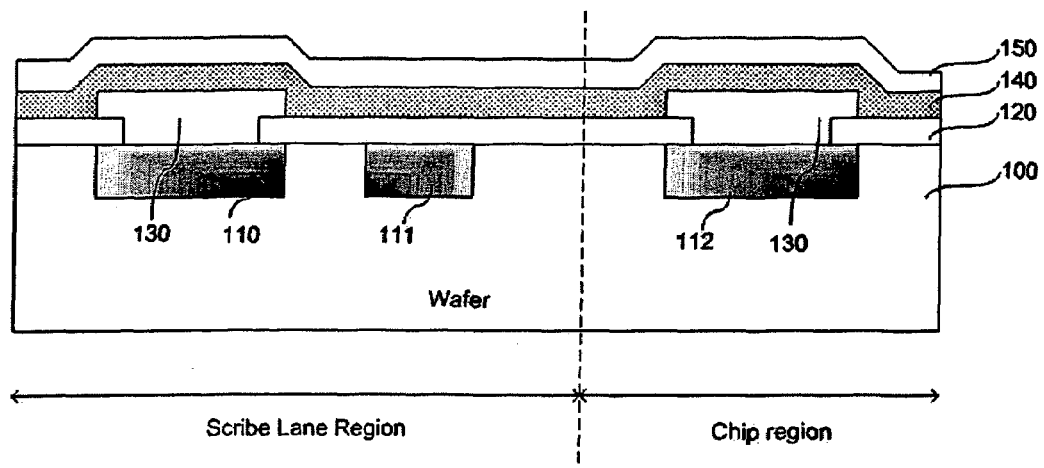
Figure 1D:
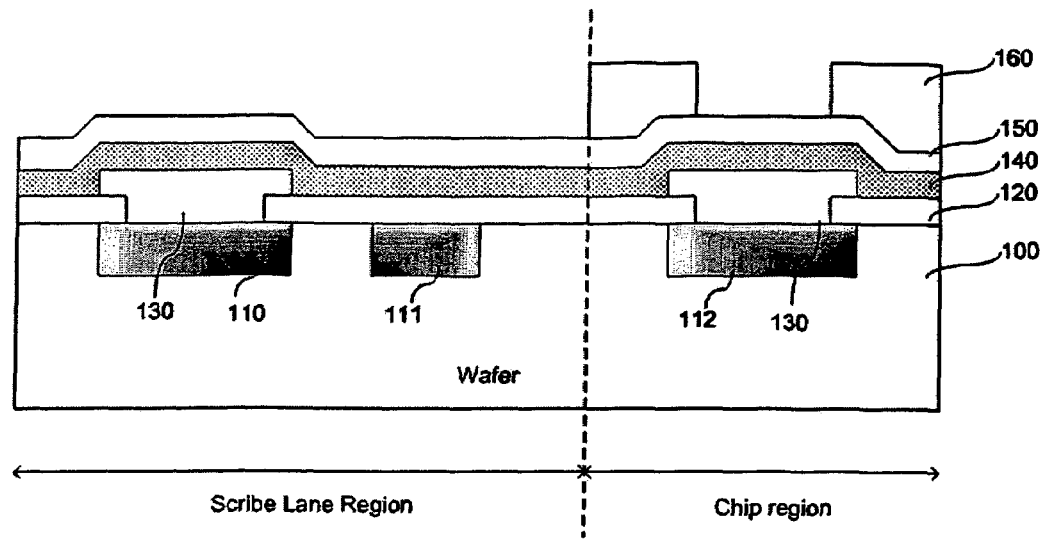
Figure 1E:
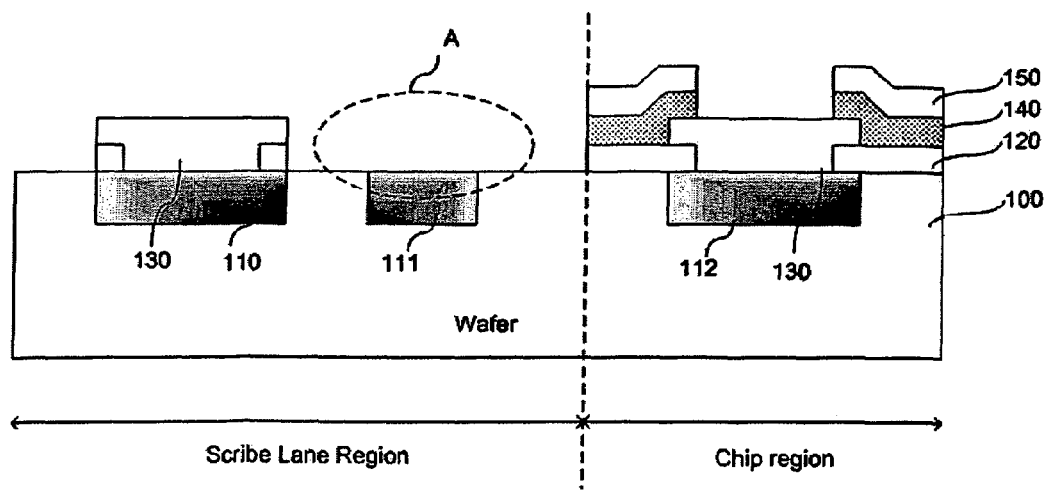

Embodiments of the present invention will hereinafter be described in detail with reference to the accompanying drawings. In the following detailed description, only certain exemplary embodiments of the present invention have been shown and described, simply by way of illustration. As those skilled in the art would realize, the described embodiments may be modified in various different ways, all without departing from the spirit or scope of the present invention.

To clarify multiple layers and regions, the thicknesses of the layers are enlarged in the drawings. Like reference numerals designate like elements throughout the specification. When it is said that any part, such as a layer, film, area, or plate is positioned on another part, it means the part is directly on the other part or above the other part with at least one intermediate part. On the other hand, if any part is said to be positioned directly on another part it means that there is no intermediate part between the two parts.

Figure 2A:
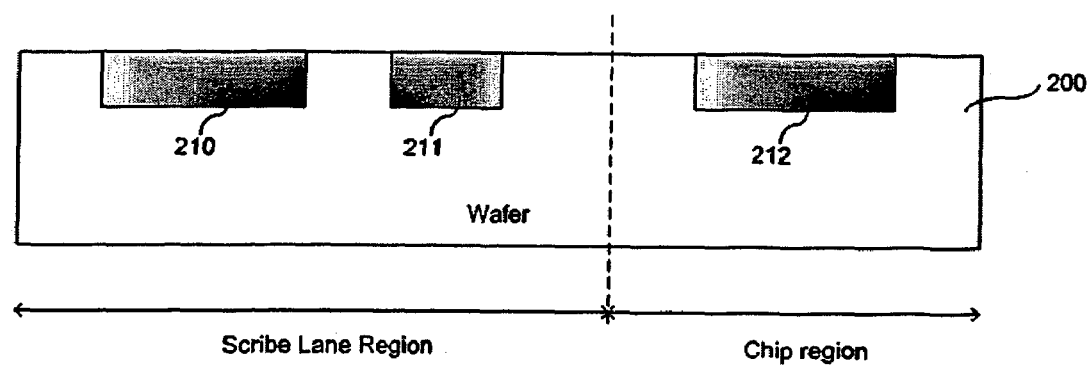
FIG. 2A to FIG. 2E are cross-sectional views showing a method of manufacturing a semiconductor device consistent with embodiments of the present invention.

FIG. 2A to FIG. 2E are cross-sectional views showing a method of manufacturing a semiconductor device consistent with embodiments of the present invention. As shown in FIG. 2A, a wafer 200 includes a scribe lane region where a scribe lane is formed and a chip region where a semiconductor chip is formed. A pad 210 and an inter-connection line 211, both of which include a metal, are formed in the scribe lane region of the wafer 200, and a pad 212 including a metal is formed in the chip region. Pad 210, inter-connection line 211, and pad 212 are formed by a metal line process using copper (Cu).

Figure 2B:
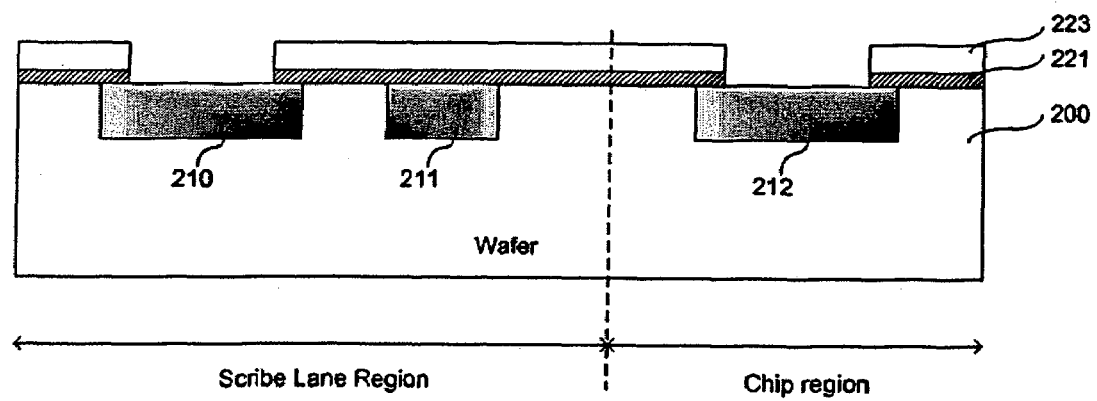

As shown in FIG. 2B, an etch-stop layer 221 and a first insulation layer 223 are sequentially deposited on pad 210, inter-connection line 211, and pad 212, and then etched using a pre-pad open mask to expose pad 210 in the scribe lane region and pad 212 in the chip region. Etch-stop layer 221 has a different etching rate than first insulation layer 223, and also has a different etching rate than a second insulation layer 240 and a third insulation layer 250 to be formed later. Etch-stop layer 221 may comprise a nitride. Etch-stop layer 221 may have a minimum thickness such that inter-connection line 211 is not exposed when first insulation layer 223, second insulation layer 240, and third insulation layer 250 are etched.

Figure 2C:
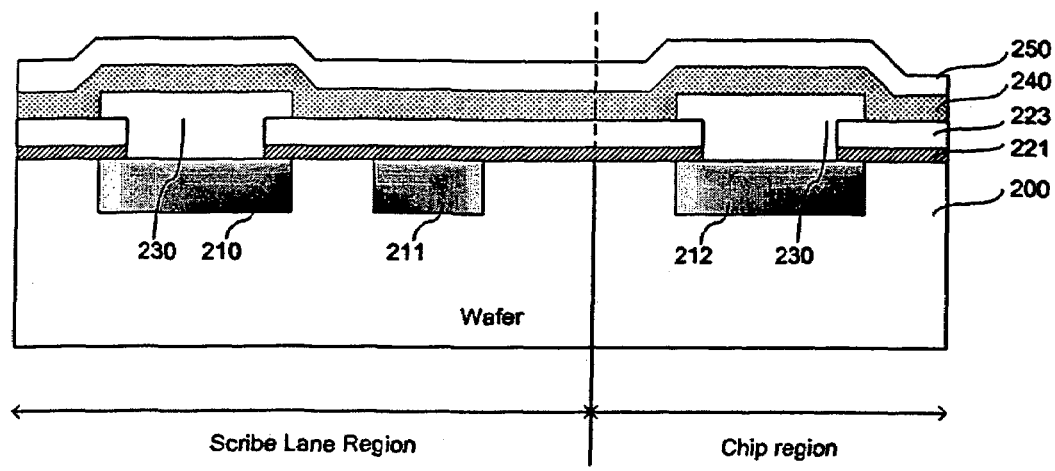

Referring to FIG. 2C, metal pads 230 including aluminum (Al) is formed on pads 210 and 212. The aluminum-based metal pads 230 on pads 210 and 212 prevent the corrosion of copper in pads 210 and 212 when pads 210 and 212 are otherwise exposed to the air. The aluminum-based metal pads 230 on pads 210 and 212 also provide for easier wire bonding because copper in pads 210 and 212 does not have a proper contact temperature with, respect to platinum or gold used for wire bonding.

Subsequently, second insulation layer 240 and third insulation layer 250 are sequentially deposited on first insulation layer 223 and metal pad 230. Second insulation layer 240 may comprises an oxide and third insulation layer 250 may comprise a nitride. Both second insulation layer 240 and third insulation layer 250 are used as passivation layers.

Figure 2D:
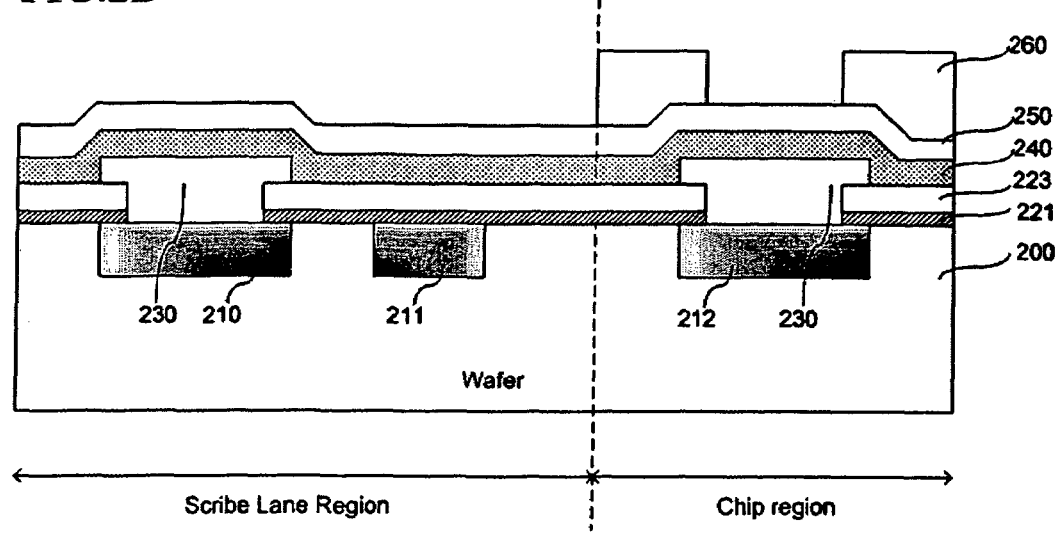

In addition, as shown in FIG. 2D, a photosensitive layer pattern 260 is formed using pad open mask for exposing metal pads 230. Photosensitive layer pattern 260 also exposes first insulation layer 223, second insulation layer 240, and third insulation layer 250 in the scribe lane region.

Figure 2E:
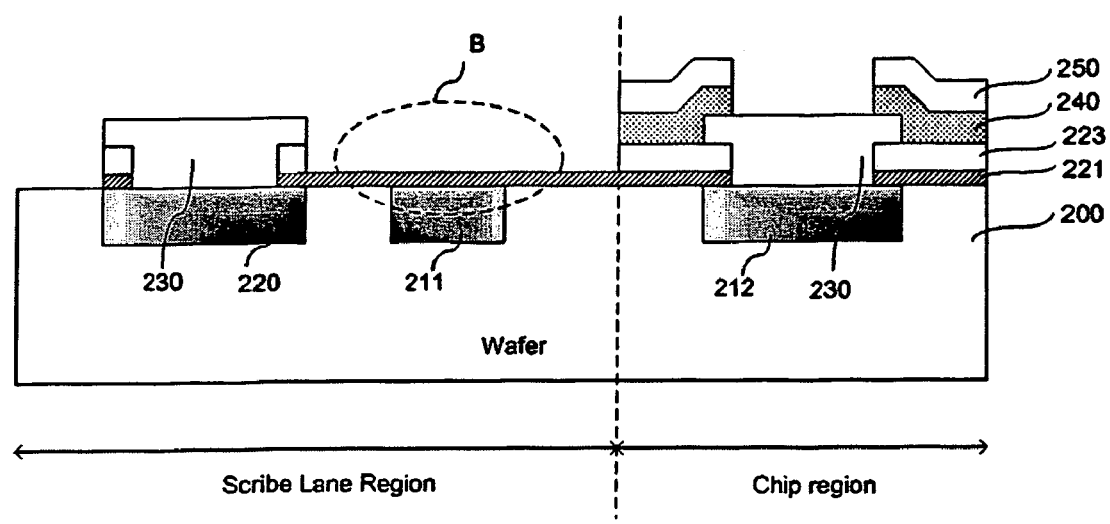

As shown in FIG. 2E, first insulation layer 223, second insulation layer 240, and third insulation layer 250 are etched using photosensitive layer pattern 260 as a mask until etch-stop layer 221 is exposed. Accordingly, metal pads 230 in the scribe lane region and the chip region are exposed. Also, as shown in FIG. 2E, in region 'B', inter-connection line 211 in the scribe lane is still covered by etch-stop layer 221. Therefore, copper in inter-connection line 211 is protected from possible erosion through reaction with oxygen in the air. As a result, the yield and reliability of a semiconductor device are enhanced.

According to the embodiments of the present invention, the corrosion of copper can be effectively prevented because the copper line in the scribe lane region is not exposed due to the etch-stop layer. Consequently, possible particle contamination of the peripheral circuit and the chip region caused by the corrosion of the copper line in the scribe lane region is prevented, and the yield and reliability of a semiconductor device may be enhanced.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A method of manufacturing a semiconductor device on a wafer including a scribe lane region and chip region, comprising:

forming a first pad including a first metal and an inter-connection line including the first metal in the scribe lane region;

forming a second pad including the first metal in the chip region;

sequentially forming an etch-stop layer and a first insulation layer on the first pad, the inter-connection line, and the second pad;

exposing the first and second pads by patterning the etch-stop layer and the first insulation layer;

forming third and fourth pads including a second metal on the first and second pads;

sequentially forming second and third insulation layers on the third pad, the fourth pad, and the patterned first insulation layer; and etching the first, second, and third insulation layers using the patterned photosensitive layer on the third insulation layer to expose the third and fourth pads.

2. The method of claim 1, wherein the first metal is copper.

3. The method of claim 1, wherein the second metal is aluminum.

4. The method of claim 1, wherein the etch-stop layer has a different etching rate than the first, second, and third insulation layers.

5. The method of claim 4, wherein forming the etch-stop layer comprises forming a layer of a nitride.

6. The method of claim 4, wherein the etch-stop layer has a thickness such that the second pad is not exposed when the first, second, and third insulation layers are etched.

7. The method of claim 1, wherein forming the first and second insulation layers comprise forming layers of an oxide.

8. The method of claim 6, wherein forming the first and second insulation layers comprise forming layers of an oxide.

9. The method of claim 1, wherein forming the third insulation layer comprises forming a layer of nitride.

10. The method of claim 6, wherein forming the third insulation layer comprises forming a layer of nitride.

11. The method of claim 1, wherein the second and third insulation layers are passivation layers.

12. The method of claim 6, wherein the second and third insulation layers are passivation layers.

\* \* \* \* \*